(12) United States Patent
Lin et al.

(10) Patent No.: US 8,542,549 B2
(45) Date of Patent: Sep. 24, 2013

(54) ELECTRICAL FUSE BIT CELL

(75) Inventors: Sung-Chieh Lin, Zhubei (TW); Wei-Li Liao, Taichung (TW); Kuoyuan (Peter) Hsu, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 72 days.

(21) Appl. No.: 13/205,009

(22) Filed: Aug. 8, 2011

(65) Prior Publication Data
US 2013/0039117 A1   Feb. 14, 2013

(51) Int. Cl.
*G11C 17/18* (2006.01)
(52) U.S. Cl.
USPC .......................... 365/225.7; 365/96
(58) Field of Classification Search
USPC ...................... 365/225.5, 96, 225.7
See application file for complete search history.

(56) References Cited

U.S. PATENT DOCUMENTS

| | | | |
|---|---|---|---|
| 4,312,046 A | 1/1982 | Taylor | |
| 5,257,230 A | 10/1993 | Nobori et al. | |
| 5,313,426 A | 5/1994 | Sakuma et al. | |
| 5,321,286 A | 6/1994 | Koyama et al. | |
| 5,936,881 A | 8/1999 | Kawashima et al. | |
| 6,480,406 B1 | 11/2002 | Jin et al. | |
| 6,819,612 B1 * | 11/2004 | Achter | 365/205 |
| 6,845,029 B2 * | 1/2005 | Santin et al. | 365/96 |
| 6,937,508 B1 * | 8/2005 | Hakkarainen | 365/171 |
| 7,369,452 B2 * | 5/2008 | Kenkare et al. | 365/225.7 |
| 7,501,879 B1 * | 3/2009 | Oh et al. | 327/525 |
| 7,724,600 B1 | 5/2010 | Im et al. | |
| 7,847,587 B2 * | 12/2010 | Kobayashi | 326/38 |
| 7,940,548 B2 | 5/2011 | Wang et al. | |
| 2002/0036918 A1 | 3/2002 | Hidaka | |
| 2005/0189613 A1 | 9/2005 | Otsuka et al. | |

* cited by examiner

*Primary Examiner* — Pho M Luu
(74) *Attorney, Agent, or Firm* — Lowe Hauptman & Ham, LLP (57) ABSTRACT

An electrical fuse (eFuse) bit cell includes a program transistor, a read transistor, and an eFuse. The program transistor has a first program terminal, a second program terminal, and a third program terminal. The read transistor has a first read terminal, a second read terminal, and a third read terminal. The eFuse has a first end and a second end. The first end, the first program terminal, and the second read terminal are coupled together. The read transistor is configured to be off and the program transistor is configured to be on when the eFuse bit cell is in a program mode. The program transistor is configured to be off and the read transistor is configured to be on when the eFuse bit cell is in a read mode.

25 Claims, 10 Drawing Sheets

|  | PROGRAM MODE | READ MODE |
|---|---|---|
| PROGRAM NODE | VprogN | 0V |
| SprogB | 0V | VDDIO |
| Srd | 0V | VDDIO |
| PWL_0 | VDDIO OR VprogN | 0V |
| PWL_1 | 0V | 0V |
| PWL_2 | 0V | 0V |
| PWL_3 | 0V | 0V |
| RWL_0 | 0V | VDDIO |
| RWL_1 | 0V | 0V |
| RWL_2 | 0V | 0V |
| RWL_3 | 0V | 0V |

|  | PROGRAM MODE | READ MODE |
| --- | --- | --- |
| PROGRAM NODE | VprogN | VDDIO |
| Sprog | VDDIO OR VprogN | 0V |
| SrdB | PROGRAM VOLTAGE | 0V |
| PWLB_0 | 0V | VDDIO |
| PWLB_1 | VprogN | VDDIO |
| PWLB_2 | VprogN | VDDIO |
| PWLB_3 | VprogN | VDDIO |
| RWLB_0 | VprogN | 0V |
| RWLB_1 | VprogN | VDDIO |
| RWLB_2 | VprogN | VDDIO |
| RWLB_3 | VprogN | VDDIO |

ELECTRICAL FUSE BIT CELL

FIELD

The present disclosure is related to an electrical fuse (eFuse) bit cell.

BACKGROUND

In an approach known to the applicants, an NMOS transistor is used for both a read and a program operation in a one transistor (1T) eFuse bit cell. In some conditions, the applicants have recognized that the bit line current leakage can degrade the performance of an amplifier used in sensing the data for the bit cell.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art. Reference numbers may be repeated throughout the embodiments, but they do not require that feature(s) of one embodiment apply to another embodiment, even if they share the same reference number.

Some embodiments have one or a combination of the following features and/or advantages. The size of the eFuse bit cell is smaller that the size of another eFuse bit cell known to the applicants. Performance of a sense amplifier working in conjunction with the eFuse bit cell is improved. Each transistor in the eFuse bit cell has a dedicated function for a program operation or a read operation, and is therefore optimized in terms of performance. Compared with a known eFuse bit cell, a first transistor used as a program device in the eFuse bit cell in various embodiments has a smaller length and a larger size. As a result, the program current is increased. The bit line leakage current, however, is not increased. A second transistor used in the read operation has a longer length and a short width to reduce the bit line leakage current. The program current, however, is not compromised.

Exemplary Circuits, First Embodiments

Figure 1:
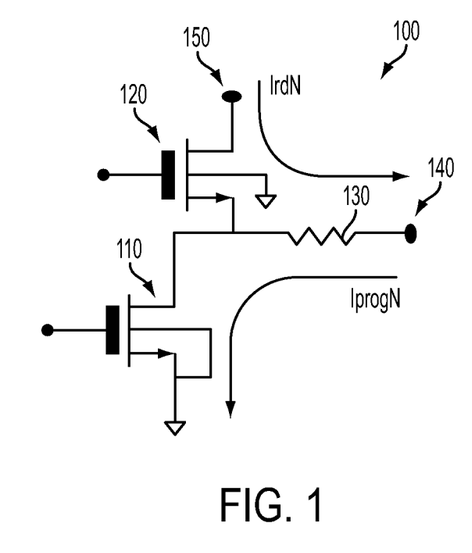
FIG. 1 is a diagram of an electrical fuse bit cell, in accordance with a first embodiment.

FIG. 1 is a diagram of an eFuse bit cell 100, in accordance with some embodiments. eFuse bit cell 100 includes, a program transistor 110, a read transistor 120 and an eFuse 130.

When eFuse 130 is not programmed, eFuse 130 is "closed." The resistance value of eFuse 130 is relatively small, and is about 5Ω to 200Ω in some embodiments. In contrast, after eFuse 130 is programmed, eFuse 130 is "open," and the resistance value of eFuse 130 is relatively large, which is about 1 KΩ to 100 MΩ in some embodiments. Node 140 is called the program node while node 150 at the drain of transistor 120 is called the read node.

In a program operation, read transistor 120 is turned off and is therefore electrically disconnected from eFuse 130. Program transistor 110 is turned on, and voltage VprogN (not labeled) is applied at program node 140 at one end of eFuse 130. Program current IprogN flows from program node 140 through eFuse 130 and transistor 110 to ground at the source of transistor 110. As a result, eFuse 130 is programmed and has a high resistance value. In some embodiments, voltage VprogN is about 1.8 V, current IprogN is about 20 mA, and operational voltage VDD (not labeled) for both transistor 110 and transistor 120 is about 0.85 V.

In a read operation, program transistor 110 is turned off, and is therefore electrically disconnected from eFuse 130. Read transistor 120 is turned on. A read current IrdN is forced to read node 150 at the drain of NMOS transistor 120. Current IrdN flows through transistor 120, eFuse 130, and node 140. In some embodiments, current IrdN is about 0.5 mA. Further, detecting a voltage value at read node 150 reveals the data stored in bit cell 100. For example, if eFuse 130 is programmed or open, the high resistance of eFuse 130 results in a high voltage value at read node 150. If eFuse 130 is not programmed or closed, however, the low resistance of eFuse 130 results in a low voltage value at read node 150.

In some embodiments, program current IprogN is relatively larger than read current IrdN. As a result, program transistor 110 is designed relatively larger than read transistor 120. The size of each transistor 110 and 120 is selected based on simulation. For example, a program current IprogN sufficient to break (e.g., to program) eFuse 130 is determined. The size of transistor 110 is then selected based on the determined current IprogN. In some embodiments, transistor 110 is sized such that transistor 110 can sink the determined current IprogN.

With respect to the read operation, a read current IrdN sufficient to generate a read voltage at read node 150 at the drain of transistor 120 is determined. The size of transistor 120 is then selected based on the determined read current IrdN. In some embodiments, transistor 120 is selected such that transistor 120 can source current IrdN.

In some embodiments, bit cell 100 is part of a memory array in which a bit line is coupled to the drains of a plurality of transistors 120. When a bit cell associated with a bit line is read, other bit cells associated with the same bit line are turned off. The turned off bit cells, however, continue to experience leakage current that affects the current on the bit line coupled to the drains of transistors 120. The size of a read transistor 120 is selected based on the total current including the leakage current associated with the bit line. In some embodiments, the ratio W/L is considered, wherein W is the width of transistor 120 and L is the length of transistor 120. The leakage current is inversely proportional to the length L of a transistor 120. In some embodiments, a smallest length L that corresponds to an acceptable leakage current is selected. The width W is then selected based on the length L.

Various embodiments are advantageous because the size of each transistor 110 and 120 is selected based on the particular program or read current, respectively. As a result, performance of bit cell 100 is optimized for each of a program and a read operation. In other approaches using one transistor for both programming and reading, a large program transistor providing a large program current could be over-designed in the read operation in which the read current does not need to be as large as the program current.

In some embodiments, read node 150 at the drain of read transistor 120 is connected to a read bit line, and program node 140 is connected to a program bit line of an eFuse memory array.

Figure 2:
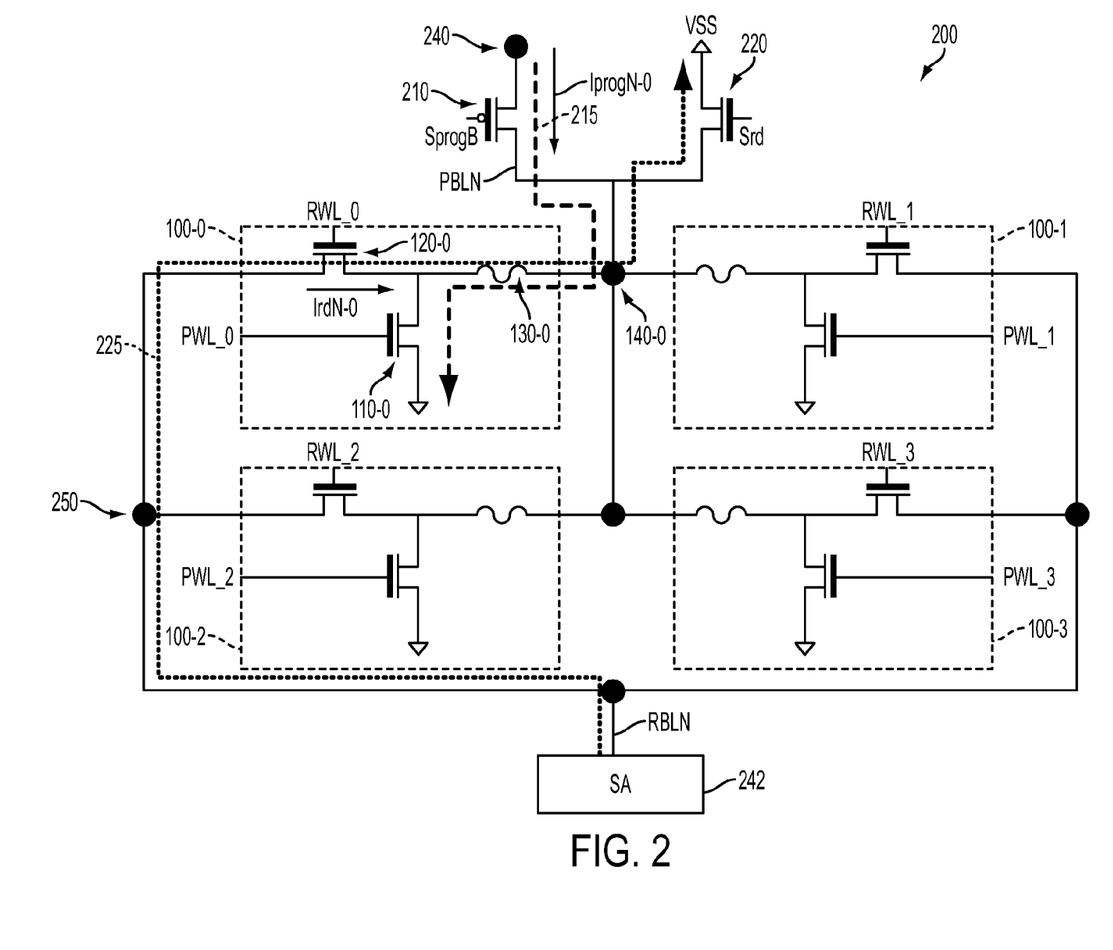
FIG. 2 is a diagram of an electrical fuse memory array of the bit cells in FIG. 1, in accordance with some embodiments.

FIG. 2 is a diagram of an eFuse memory array 200, in accordance with some embodiments. For illustration, array 200 is a 4×1 bit cell array. That is, there are four bit cells associated with one bit line. The four bit cells include bit cells 100-0, 100-1, 100-2, and 100-3. One bit line includes a pair of a read bit line RBLN and a program bit line PBLN. For illustration, program transistor 110, read transistor 120, eFuse 130, and node 140 of bit cell 100-0 are labeled as 110-0, 120-0, 130-0, and 140-0, respectively. Program transistor 110, read transistor 120, and eFuse 130 of bit cells 100-1, 100-2, and 100-3 are not labeled, but should be recognizable by persons of ordinary skill in the art.

Four bit cells 100-0, 100-1, 100-2, and 1003 correspond to four read word lines RWL_0, RWL_1, RWL_2, and RWL_3, and four program word lines PWL_0, PWL_1, PWL_2, and PWL_3. As a result, the 4×1 representation of bit cell array 200 also indicates a set of four program word lines and a set of four read word lines and one bit line.

The gates of program transistors 110 of bit cells 100-0, 100-1, 100-2, and 100-3 are configured to receive program word lines PWL_0, PWL_1, PWL_2, and PWL_3, respectively. The gates of read transistors 120 of bit cells 100-0, 100-1, 100-2, and 100-3 are configured to receive read word lines RWL_0, RWL_1, RWL_2, and RWL_3, respectively.

Program PMOS transistor 210 is used to program each of bit cell 100-0, 100-1, 100-2, and 100-3. In other words, transistor 210 is shared by bit cells 100-0, 100-1, 100-2, and 100-3 in a program operation. Node 240 at the source of shared program transistor 210 is called the program node for array 100, and is configured to receive program voltage VprogN (not labeled). The drain of transistor 210 is coupled to nodes 140 of each eFuse 130 of each bit cell 100-0, 100-1, 100-2, and 100-3. The gate of transistor 210 is configured to receive a program signal SprogB. Line 215 illustrates the flow of program current IprogN-0 when bit cell 100-0 is programmed. For example, when bit cell 100-0 is programmed, read word line RWL_0 of bit cell 100-0 is deactivated to electrically disconnect read transistor 120-0 from eFuse 130-0. Program word line PWL_0 is activated to turn on cell program transistor 110-0. Signal SprogB is activated to turn on shared program transistor 210. As a result, current IprogN-0 flows from node 240 at the source of transistor 210 through the drain of transistor 210, eFuse 130-0, the drain of transistor 110-0, and the source of transistor 110-0 or ground, as illustrated by 215. Current IprogN-0 causes fuse eFuse 130-0 to break or bit cell 100-0 to be programmed. Alternatively explained, when transistor 210 and transistor 110-0 are turned on, program voltage VprogN at node 240 at the source of transistor 210 is passed to the drain of transistor 210 to program eFuse 130-0.

Read NMOS transistor 220 serves as a current path for each of bit cell 100-0, 100-1, 100-2, and 100-3 to be read. In other words, transistor 220 is shared by bit cells 100-0, 100-1, 100-2, and 100-3 for a read operation. The source of shared read transistor 220 is configured to receive reference voltage VSS or ground. The drain of transistor 220 is coupled to nodes 140 of each eFuse 130 of each bit cell 100-0, 100-1, 100-2, and 100-3. The gate of transistor 220 is configured to receive a read signal Srd. The drains of cell read transistors 120-0, 120-1, 102-2, and 120-3 are coupled together and form a read node 250 for array 100. Read node 250 is coupled to sense amplifier 242 through read bit line RBLN. Line 225 illustrates the flow of read current IrdN-0 when bit cell 100-0 is read.

For example, when bit cell 100-0 is read, program word line PWL_0 of bit cell 100-0 is deactivated to electrically disconnect cell program transistor 110-0 from eFuse 130-0. Read word line RWL_0 is activated to turn on cell read transistor 120-0. Signal Srd is activated to turn on shared read transistor 220. Sense amplifier 242 is turned on. As a result, current IprogN-0 flows from sense amplifier 242 through read bit line RBLN, node 250 at the drain of transistor 120-0, the source of transistor 120-0, eFuse 130-0, the drain of transistor 220, and the source of transistor 220 or ground, as illustrated by line 225. Sense amplifier 242 then senses and amplifies the voltage value at node 250 or read bit line RBLN to indicate the program condition of bit cell 100-0. For example, if eFuse 130-0 is not programmed, the voltage value at read bit line RBL is low, and bit cell 100-0 is considered storing a low logic value. But if eFuse 130-0 has been programmed, the voltage value at read bit line RBLN is high, and bit cell 100-0 is considered storing a high logic value. In some embodiments, if the voltage value at read bit line RBLN is higher than ½ VDD, then bit cell 100-0 is considered storing a high voltage value. But if the voltage value at read bit line RBLN is less than ½ VDD, then bit cell 100-0 is considered storing a low voltage value.

Programming and reading bit cell 100-0 are used in the above explanation for illustration. Programming and reading other bit cells are each performed in a similar manner and should be recognizable by persons of ordinary skill in the art after reviewing this document.

Figure 3:
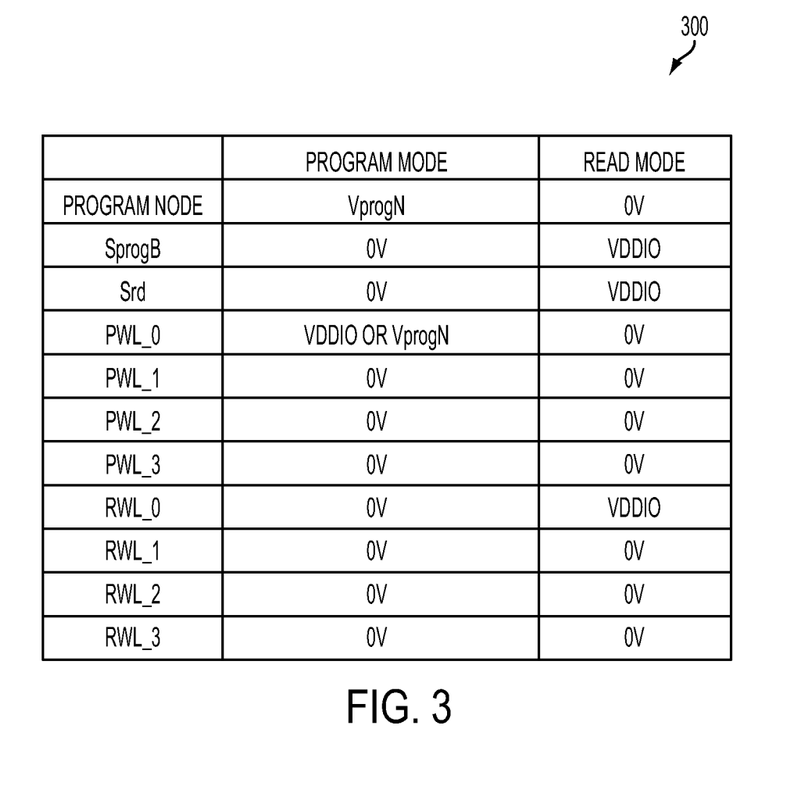
FIG. 3 is a table summarizing the operation of a bit cell of the memory array in FIG. 2, in accordance with some embodiments.

FIG. 3 is a table 300 summarizing the condition of various signals when eFuse bit cell 100-0 is in the program mode and read mode, in accordance with some embodiments. For example, when bit cell 100-0 is programmed (e.g., in the program mode), program node 240 of array 200 at the source of program transistor 210, signal SprogB, signal Srd, program word line PWL_0, program word line PWL_1, program word line PLW_2, program word line PWL_3, read word line RWL_0, read word line RWL_1, read word line RWL_2, and read word line RWL_3 are at VprogN, 0 V, 0 V, VDDIO, 0 V, 0 V, 0 V, 0 V, 0V, 0 V, and 0 V, respectively. Voltage VDDIO is the operational voltage of IO transistors in a memory platform. In some embodiments, program voltage VprogN is equal to voltage VDDIO or higher.

In contrast, when bit cell 100-0 is read (e.g., in the read mode), the source of transistor 210, signal SprogB, signal Srd, program word line PWL_0, program word line PWL_1, program word line PLW_2, program word line PWL_3, read word line RWL_0, read word line RWL_1, read word line RWL_2, and read word line RWL_3 are at 0 V, VDDIO, VDDIO, 0 V, 0 V, 0 V, 0 V, VDDIO, 0 V, 0 V, 0V, respectively.

Memory array 200 shown having four bit cells 100 is for illustration. A different number of bit cells 100 used in a memory array is within the scope of various embodiments. For example, one or a plurality of bit cells may be removed or added to array 200 to form a new array having a different number of bit cells sharing the same share program transistor 210, shared read transistor 220, and sense amplifier 242. Similarly, one or a plurality of arrays 200 may be added to form another new array having a different number of bit lines. For example, an (N−1) number of arrays similar to array 200 is added to form a 4×N memory array, wherein N is an integer number. Further, if memory array 200 is changed to have M number of bit cells, then the new memory array would be an M×N memory array.

Exemplary Circuits, Second Embodiments

Figure 4:
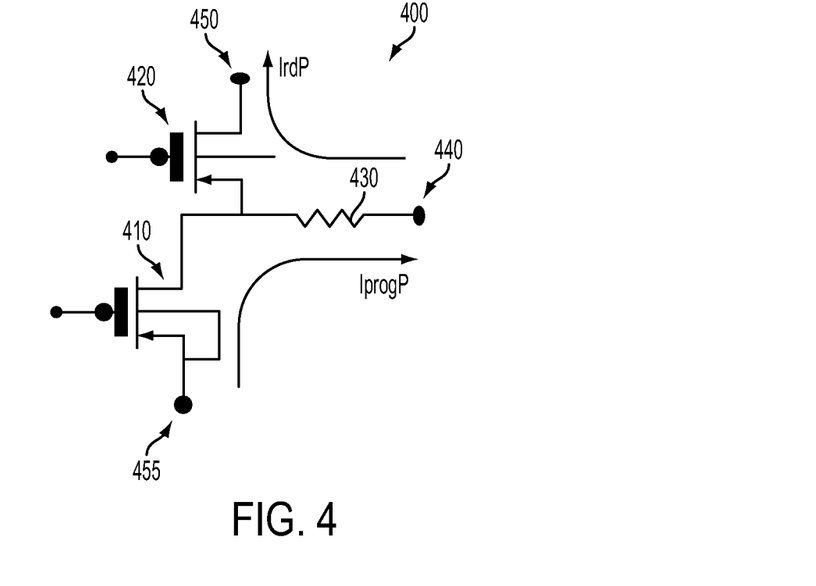
FIG. 4 is a diagram of an electrical fuse bit cell, in accordance with a second embodiment.

FIG. 4 is a diagram of an eFuse bit cell 400, in accordance with some embodiments. Program transistor 410, read transistor 420, and eFuse 430 correspond to program transistor 110, read transistor 120, and eFuse 130 in FIG. 1, respectively. Program transistor 110 and read transistor 120 in FIG. 1, however, are NMOS transistors while program transistor 410 and read transistor 420 are PMOS transistors. As a result, different voltage values applied at the drains, the sources, and the gates of transistors 410 and 420 are applied accordingly. For example, node 455 at the source of transistor 410 is configured to receive voltage VprogP and serves as a program node. The drain of transistor 410 is coupled to one end of eFuse 430 and the source of transistor 420, etc.

In a program operation, read transistor 420 is turned off and is therefore electrically disconnected from eFuse 430. Program transistor 410 is turned on, and voltage VprogP is applied at node 455 at the source of transistor 410. Program current IprogP flows through transistor 410, eFuse 430, and node 440. As a result, eFuse 430 is programmed and has a high resistance value. In some embodiments, program current IprogP is about 20 mA.

In a read operation, program transistor 410 is turned off, and is therefore electrically disconnected from eFuse 430. Read transistor 420 is turned on. A current IrdP is forced to node 440. Current IrdP flows through eFuse 430 and transistor 420. In some embodiments, read current IrdP is about 0.5 mA, and detecting a voltage value at read node 450 at the drain of transistor 420 reveals the data stored in bit cell 400. For example, if eFuse 430 is programmed or open, the high resistance of eFuse 430 results in a high voltage value at node 450 at the drain of transistor 430. If eFuse 430 is not programmed or closed, however, the low resistance of eFuse 430 results in a low voltage value at node 450.

In some embodiments, program current IprogP is relatively larger than read current IrdP. As a result, program transistor 410 is designed relatively larger than read transistor 420. The size of each transistor 410 and 420 is selected based on simulation. For example, a program current IprogP sufficient to break (e.g., program) eFuse 430 is determined. The size of transistor 410 is then selected based on the determined current IprogP. In some embodiments, transistor 410 is sized such that transistor 410 can source the determined current IprogP.

With respect to the read operation, a read current IrdP sufficient to generate a read voltage at node 450 at the drain of transistor 420 is determined. The size of transistor 420 is then selected based on the determined read current IrdP. In some embodiments, transistor 420 is selected such that transistor 420 can sink current IrdP.

In some embodiments, bit cell 400 is part of a memory array in which a bit line is coupled to the drains of a plurality of transistors 420. When a bit cell associated with a bit line is read, other bit cells associated with the same bit line are turned off. The turned off bit cells, however, continue to experience leakage current affecting the current on the bit line coupled to the drains of transistors 420. The size of a read transistor 420 is selected based on the total current including the leakage current associated with the bit line. In some embodiments, the ratio W/L is considered, wherein W is the width of transistor 420 and L is the length of transistor 420. The leakage current is inversely proportional to the length L of a transistor 420. In some embodiments, a smallest length L that corresponds to an acceptable leakage current is selected. The width W is then selected based on the length L.

Various embodiments are advantageous because the size of each transistor 410 and 420 is selected based on the particular program or read current, respectively. As a result, performance of bit cell 400 is optimized for each of a program and a read operation. In other approaches, a large program transistor providing a large program current could be over-designed in the read operation in which the read current does not need to be as large as the program current.

In some embodiments, the drain of transistor 420 or node 450 is connected to a read bit line, and node 440 is connected to a program bit line of an eFuse memory array.

Figure 5:
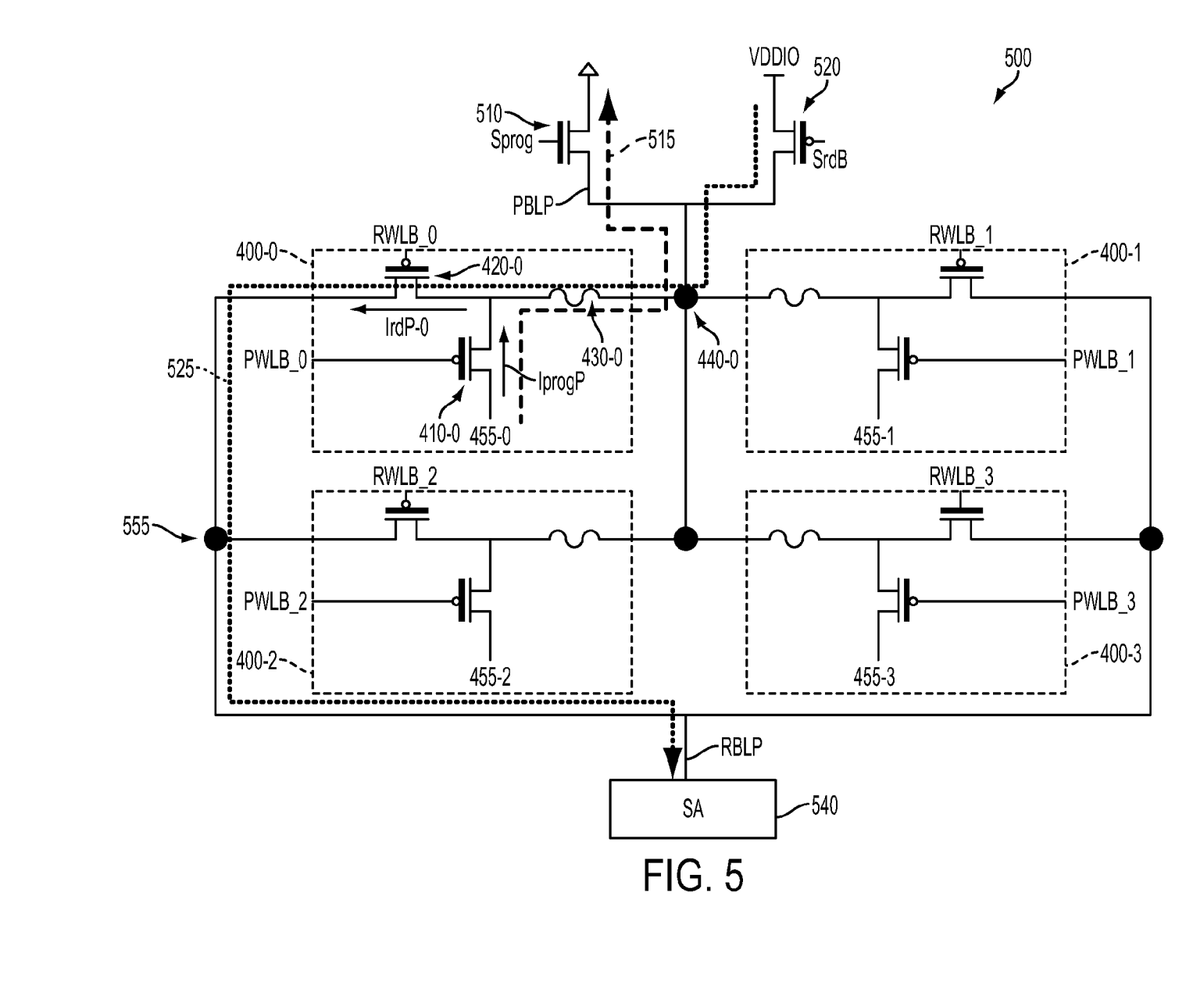
FIG. 5 is a diagram of an electrical fuse memory array of the bit cells in FIG. 4, in accordance with some embodiments.

FIG. 5 is a diagram of an eFuse memory array 500, in accordance with some embodiments. For illustration, array 500 is a 4×1 bit cell array. That is, there are four bit cells associated with one bit line. The four bit cells include bit cells 400-0, 400-1, 400-2, and 400-3. One bit line includes a pair of a program bit line PBLP and a read bit line RBLP. For illustration, program transistor 410, read transistor 420, eFuse 430, and node 440 of bit cell 400-0 are labeled as 410-0, 420-0, 430-0, and 440-0, respectively. Program transistor 410, read transistor 420, and eFuse 430 of bit cells 400-1, 400-2, and 100-3 are not labeled, but should be recognizable by persons of ordinary skill in the art.

Four bit cells 400-0, 400-1, 400-2, and 400-3 correspond to four read word lines RWLB_0, RWLB_1, RWLB_2, and RWLB_3, and four program word lines PWLB_0, PWLB_1, PWLB_2, and PWLB_3. As a result, the 4×1 representation of bit cell array 500 also indicates a four word line and one bit line bit cell array.

The gates of program transistors 410 of bit cells 400-0, 400-1, 400-2, and 400-3 are configured to receive program word lines PWLB_0, PWLB_1, PWLB_2, and PWLB_3, respectively. The gates of read transistors 420 of bit cells 400-0, 400-1, 400-2, and 400-3 are configured to receive read word lines RWLB_0, RWLB_1, RWLB_2, and RWLB_3, respectively.

Program NMOS transistor 510 is used to program each of bit cell 400-0, 400-1, 400-2, and 400-3. In other words, transistor 510 is shared by bit cells 400-0, 400-1, 400-2, and 400-3 for a program operation. The drain of transistor 510 is coupled to nodes 440 of each eFuse 430 of each bit cell 400-0, 400-1, 400-2, and 400-3. The source of transistor 510 is configured to receive reference voltage VSS or ground. The gate of transistor 510 is configured to receive a program signal Sprog. Each source of each transistor 410-0, 410-1, 410-2, and 410-3 is configured as a program node 455-0, 455-1, 455-2, and 455-3, and receives program voltage VprogP (not labeled) in a program operation. Line 515 illustrates the flow of program current IprogP-0 when bit cell 400-0 is programmed. For example, when bit cell 400-0 is programmed, read word line RWLB_0 of bit cell 400-0 is deactivated to electrically disconnect cell read transistor 420-0 from eFuse 430-0. Program word line PWLB_0 is activated to turn on cell program transistor 410-0. Signal Sprog is activated to turn on shared program transistor 510. As a result, current IprogP-0 flows from program node 455-0 at the source of transistor 410-0 through the drain of transistor 410-0, eFuse 430-0, the drain of transistor 510, and the source of transistor 510 or ground, as illustrated by line 515. Current IprogP-0 causes fuse eFuse 430-0 to break or bit cell 400-0 to be programmed. Alternatively explained, when transistor 510 and transistor 410-0 are turned on, program voltage VprogP at node 455-0 at the source of transistor 410-0 is passed to the drain of transistor 410-0 to program eFuse 430-0.

Read PMOS transistor 520 serves as a current path for each of bit cell 400-0, 400-1, 400-2, and 400-3 to be read. The drain of transistor 520 is configured to receive voltage VDDIO. In some embodiments, voltage VDDIO is the operational voltage for IO transistors in a memory platform. The source of transistor 520 is coupled to nodes 440 of each eFuse 430 of each bit cell 400-0, 400-1, 400-2, and 400-3. The gate of transistor 520 is configured to receive a read signal SrdB. The drains of each transistor 420-0, 420-1, 420-2, and 420-3 are coupled together and form read node 555. Read node 555 is coupled to sense amplifier 540 through read bit line RBLP. Line 525 illustrates the flow of read current IrdP-0 when bit cell 400-0 is read.

For example, when bit cell 400-0 is read, program word line PWLB_0 of bit cell 400-0 is deactivated to electrically disconnect program transistor 410-0 from eFuse 430-0. Read word line RWLB_0 is activated to turn on cell read transistor 420-0. Signal SrdP is activated to turn on shared read transistor 520. Sense amplifier 540 is turned on. As a result, current Iprog-0 flows from the source of shared read PMOS transistor 520 through the drain of transistor 520, eFuse 430-0, the source of transistor 420-0, the drain of transistor 420-0 or node 555, read bit line RBLP, and sense amplifier 540, as illustrated by line 525. Sense amplifier 540 then senses and amplifies the voltage value at read bit line RBLP to reveal the program condition of bit cell 400-0. For example, if eFuse 430-0 is not programmed, the voltage value at read bit line RBLP is low, and bit cell 400-0 is considered storing a low logic value. But if eFuse 430-0 is programmed, the voltage value at read bit line RBLP is high, and bit cell 400-0 is considered storing a high logic value.

Programming and reading bit cell 400-0 are used for illustration. Programming and reading other bit cells are each performed in a similar manner and should be recognizable by persons of ordinary skill in the art.

Figure 6:
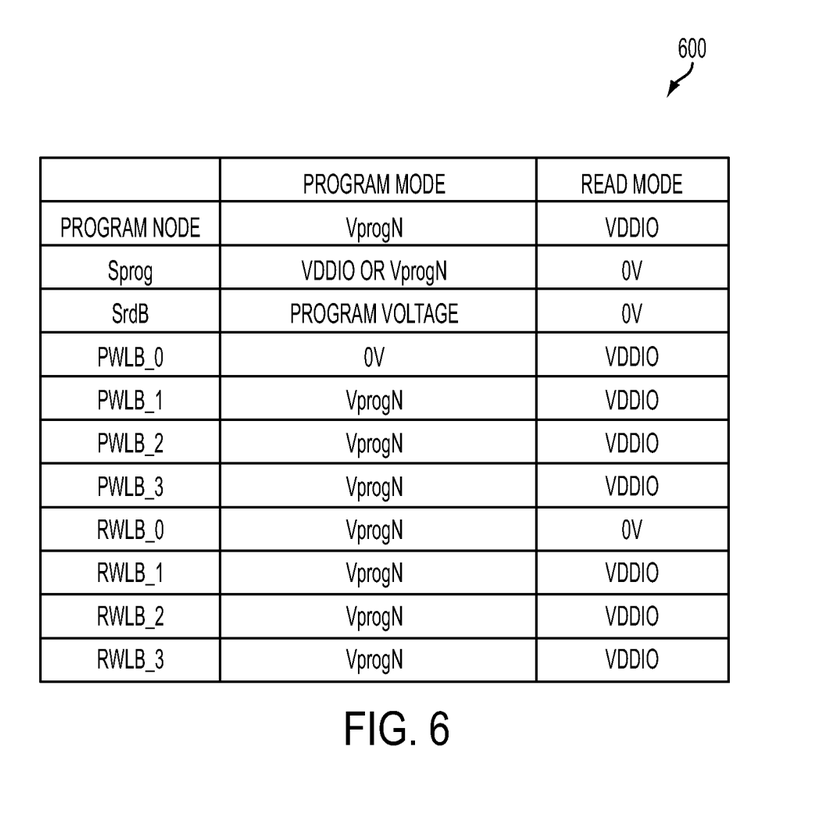
FIG. 6 is a table summarizing the operation of a bit cell of the memory array in FIG. 5, in accordance with some embodiments.

FIG. 6 is a table 600 summarizing the condition of various signals when eFuse bit cell 400-0 is in the program mode and read mode, in accordance with some embodiments. For example, when bit cell 400-0 is in the program mode, program node 455-0 at the source of transistor 410-0, signal Sprog, signal SrdB, program word line PWLB_0, program word line PWLB_1, program word line PLWB_2, program word line PWLB_3, read word line RWLB_0, read word line RWLB_1, read word line RWLB_2, and read word line RWLB_3 are at VprogP, VDDIO, VprogP, 0 V, VprogP, VprogP, VprogP, VprogP, VprogP, VprogP, and VprogP, respectively.

In contrast, when bit cell 400-0 is in the read mode, program node 455-0 at the source of transistor 410-0, signal SprogB, signal Srd, program word line PWL_0, program word line PWL_1, program word line PLW_2, program word line PWL_3, read word line RWL_0, read word line RWL_1, read word line RWL_2, and read word line RWL_3 are at VDDIO, 0 V, 0 V, VDDIO, VDDIO, VDDIO, VDDIO, 0 V, VDDIO, VDDIO, and VDDIO, respectively.

Memory array 500 shown having four bit cells 400 is for illustration. A different number of bit cells 400 used in a memory array is within the scope of various embodiments. For example, one or a plurality of bit cells may be removed or added to array 400 to form a new array having a different number of bit cells sharing the same shared program transistor 410, shared read transistor 420, and sense amplifier 540. Similarly, one or a plurality of array 400 may be added to form another new array having a different number of bit lines. For example, an (I–1) number of arrays similar to array 400 is added to form a 4×I memory array, wherein I is an integer number. Further, if memory array 200 is changed to have J number of bit cells, then the new memory array would be an J×I memory array.

Exemplary Methods

Figure 7:
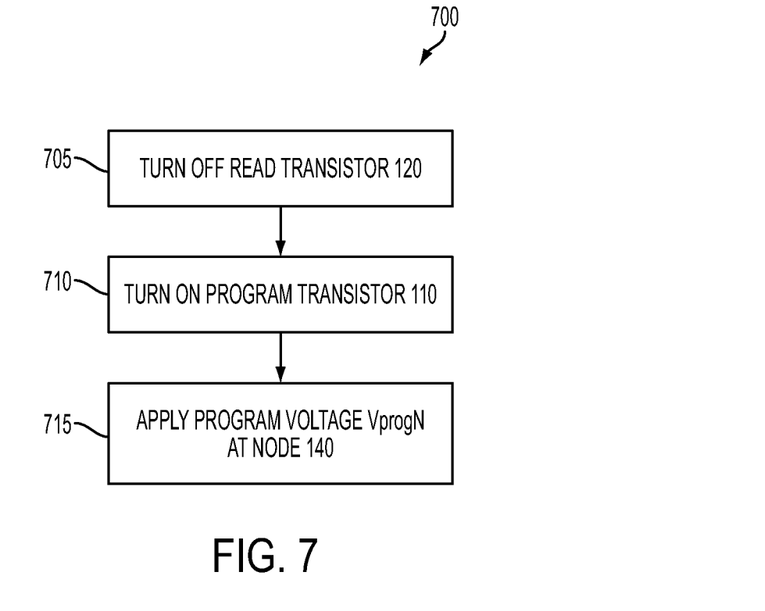
FIG. 7 is a flow chart of a method illustrating a program operation of the eFuse bit cell in FIG. 1, in accordance with some embodiments.

FIG. 7 is a flowchart of a method 700 illustrating a program operation of eFuse bit cell 100 in FIG. 1, in accordance with some embodiments.

In step 705, read transistor 120 is turned off.

In step 710, program transistor 110 is turned on.

In step 715, program voltage VprogN is applied at program node 140 to cause current IprogN to flow through eFuse 130 and program transistor 110. As a result, eFuse 130 is blown or programmed. Alternatively stated, eFuse bit cell 100 is programmed.

Figure 8:
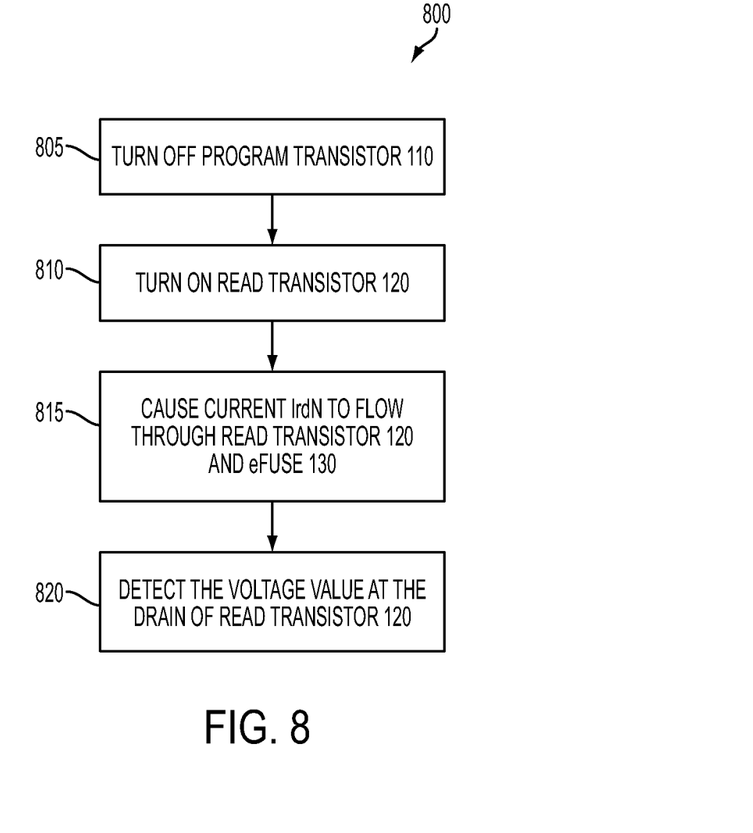
FIG. 8 is a flow chart of a method illustrating a read operation of the eFuse bit cell in FIG. 1, in accordance with some embodiments.

FIG. 8 is a flowchart of a method 800 illustrating a read operation of eFuse bit cell 100 in FIG. 1, in accordance with some embodiments.

In step 805, program transistor 110 is turned off.

In step 810, read transistor 120 is turned on.

In step 815, current IrdN is enabled to flow through read transistor 120 and eFuse 130.

In step 820, a voltage value is detected at read node 150 at the drain of read transistor 120. If the voltage value is a high logic value, then eFuse 130 has been programmed. But if the voltage value indicates a low logic value, then eFuse 130 has not been programmed.

Figure 9:
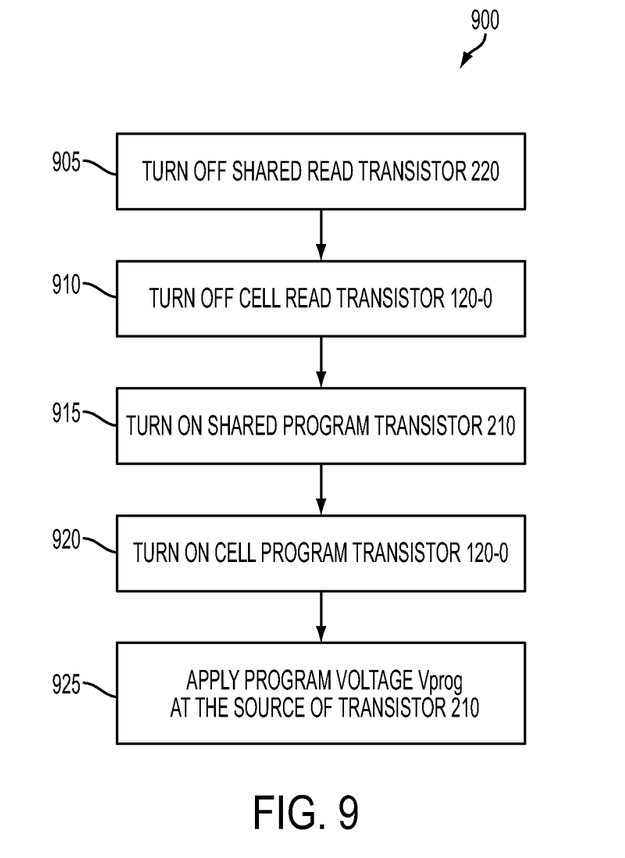
FIG. 9 is a flow chart of a method illustrating a program operation of an eFuse bit cell of the eFuse memory array 200, in accordance with some embodiments.

FIG. 9 is a flowchart of a method 900 illustrating a program operation of eFuse bit cell 100-0 of eFuse memory array 200 in FIG. 2, in accordance with some embodiments.

In step 905, shared read transistor 220 is turned off.

In step 910, cell read transistor 120-0 of eFuse bit cell 100-0 is turned off.

In step 915, shared program transistor 210 is turned on.

In step 920, cell program transistor 110-0 is turned on.

In step 925, program voltage VprogN is applied at program node 240 at the source of transistor 210, which enables current IprogN-0 to flow through shared program transistor 210, eFuse 300-0, and cell program transistor 110-0. As a result, eFuse 130-0 is blown or programmed. Alternatively stated, eFuse bit cell 100-0 is programmed.

Figure 10:
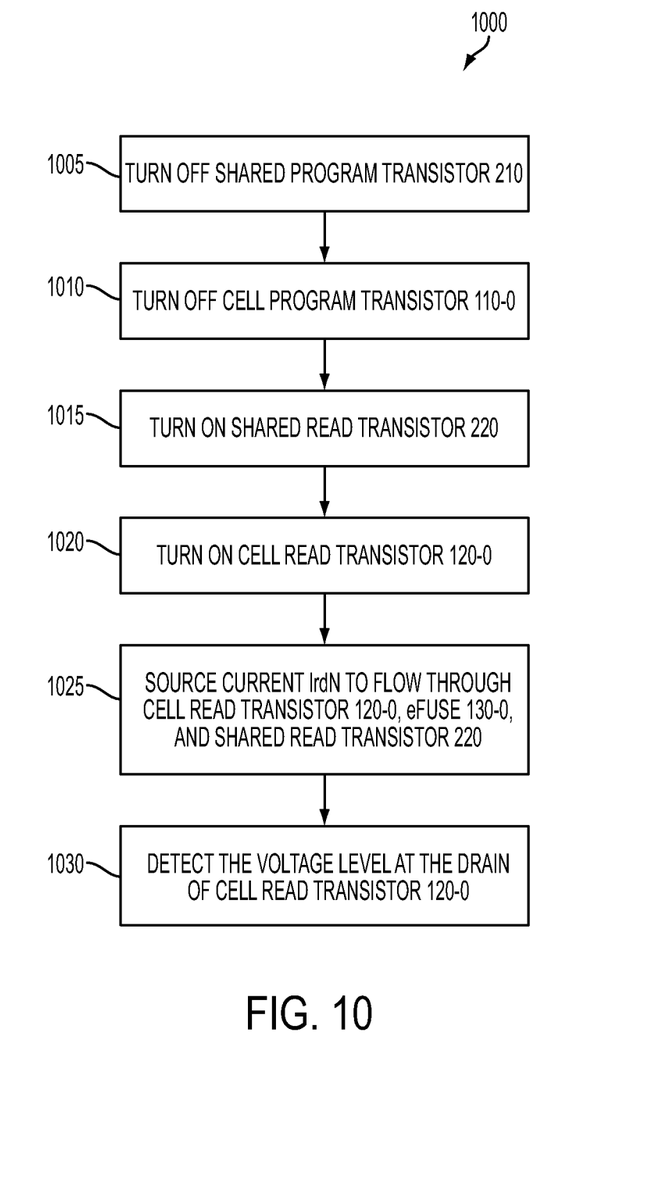
FIG. 10 is a flow chart of a method illustrating a read operation of an eFuse bit cell of the eFuse memory array 200, in accordance with some embodiments.

FIG. 10 is a flow chart of a method 1000 illustrating a read operation of eFuse bit cell 100-0 of eFuse memory array 200 in FIG. 2, in accordance with some embodiments.

In step 1005, shared program transistor 210 is turned off.

In step 1010, cell program transistor 110-0 is turned off.

In step 1015, shared read transistor 220 is turned on.

In step 1020, cell read transistor 120-0 is turned on.

In step 1025, sense amplifier 242 sources current IrdN to flow through read bit line RBLN, read transistor 120-0, eFuse 130-0, and shared read transistor 220.

In step 1030, sense amplifier 242 senses and amplifies the voltage value at read bit line RBLN or node 250 at the drain of cell read transistor 120-0. If the voltage value at read bit line RBLN reveals a high logic value, then eFuse 130-0 has been programmed. But if the voltage value at read bit line RBL indicates a low logic value, then eFuse 130-0 has not been programmed.

eFuse bit cell 100 and eFuse array 200 used in FIGS. 7-10 are for illustration. The read and program operation of the corresponding eFuse bit cell 400 and eFuse array 500 are performed in a similar manner, but are applicable to PMOS program and read transistors instead of NMOS program and transistors, and should be recognizable of persons of ordinary skill in the art.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments. Sense amplifiers 242 and 540 are used for illustration. Other reading circuits used to indicate the data stored in the eFuse memory arrays are within the scope of various embodiments. Exemplary reading circuits include single-ended sense amplifiers, differential sense amplifiers, current mirror sense amplifiers, etc.

In some embodiments, an eFuse bit cell comprises a program transistor, a read transistor, and an eFuse. The program transistor has a first program terminal, a second program terminal, and a third program terminal. The read transistor has a first read terminal, a second read terminal, and a third read terminal. The eFuse has a first end and a second end. The first end, the first program terminal, and the second read terminal are coupled together. The read transistor is configured to be off and the program transistor is configured to be on when the eFuse bit cell is in a program mode. The program transistor is configured to be off and the read transistor is configured to be on when the eFuse bit cell is in a read mode.

In some embodiments, an eFuse memory array comprises a plurality of eFuse bit cells, a shared program transistor, a shared read transistor, and a reading circuit. Each eFuse bit cell of the plurality of eFuse bit cells has a first bit cell end, a second bit cell end, a third bit cell end, and a fourth bit cell end. Each first bit cell end of each eFuse bit cell of the plurality of eFuse bit cells is coupled to the reading circuit. Each second bit cell end of each eFuse bit cell of the plurality of eFuse bit cells is coupled to the shared program transistor and the shared read transistor. Each third bit cell end of each eFuse bit cell of the plurality of eFuse bit cells is configured to receive a program word line. Each fourth bit cell end of each eFuse bit cell of the plurality of eFuse bit cells is configured to receive a read word line.

Some embodiments regard a method. In a program mode of an electrical fuse (eFuse) bit cell having a program transistor, a read transistor, and an eFuse having a first end and a second end, the read transistor is turned off. The program transistor is turned on. A program current is enabled to flow between the program transistor and the eFuse. In a read mode of the eFuse bit cell, the program transistor is turned off. The read transistor is turned on. A read current is enabled to flow between the read transistor and the eFuse. A first terminal of the program transistor, a second terminal of the read transistor, and the first end are coupled together.

Some embodiments regard a method. In a program mode of an eFuse bit cell of a plurality of eFuse bit cells, a shared read transistor is turned off. A shared program transistor is turned on. A cell read transistor of the eFuse bit cell is turned off. A cell program transistor of the eFuse bit cell is turned on. A program current is enabled to flow between the shared program transistor, the cell program transistor, and an eFuse of the eFuse bit cell. In a read mode of the eFuse bit cell, the shared program transistor is turned off. The shared read transistor is turned on. The cell program transistor is turned off. The cell read transistor is turned on. A read current is enabled to flow between the shared read transistor, the read transistor, and the eFuse. A first terminal of the cell program transistor, a second terminal of the cell read transistor, and a first end of the eFuse are coupled together. The shared program transistor, the shared read transistor, and a second end of the eFuse are coupled together.

The above methods show exemplary steps, but the steps are not necessarily performed in the order shown. Steps may be added, replaced, changed order, and/or eliminated as appropriate, in accordance with the spirit and scope of disclosed embodiments.

What is claimed is:

1. An electrical fuse (eFuse) bit cell comprising:
   a program transistor having a first program terminal, a second program terminal, and a third program terminal;
   a read transistor having a first read terminal, a second read terminal, and a third read terminal; and
   an eFuse having a first end and a second end,
   wherein
      the first end, the first program terminal, and the second read terminal are coupled together;
      the read transistor is configured to be off and the program transistor is configured to be on when the eFuse bit cell is in a program mode, the program transistor is configured to handle a program current in the program mode, the program current flowing between the eFuse and the program transistor; and
      the program transistor is configured to be off and the read transistor is configured to be on when the eFuse bit cell is in a read mode, the read transistor is configured to handle a read current in the read mode, the read current flowing between the eFuse and the read transistor.

2. The eFuse bit cell of claim 1, wherein
   each of the program transistor and the read transistor is an NMOS transistor; and
   the second end of the eFuse is configured to receive a program voltage and/or coupled to a program bit line of an eFuse memory array.

3. The eFuse bit cell of claim 1, wherein
   each of the program transistor and the read transistor is a PMOS transistor; and
   the second program terminal is configured to receive a program voltage and/or the second end is coupled to a program bit line of an eFuse memory array.

4. The eFuse bit cell of claim 1, wherein the first read terminal is configured to provide a state of the eFuse.

5. The eFuse bit cell of claim 1, wherein a first size of the program transistor is greater than a second size of the read transistor.

6. The eFuse bit cell of claim 1, wherein the eFuse bit cell is configured to satisfy at least one of the following conditions:
the third program terminal is configured to receive a program word line of an eFuse memory array; or
the third read terminal is configured to receive a read word line of the eFuse memory array.

7. The eFuse bit cell of claim 1, wherein the read current and the program current flow in opposite directions and/or the program current is greater than the read current.

8. An electrical fuse (eFuse) memory array comprising:
a plurality of eFuse bit cells, each eFuse bit cell of the plurality of eFuse bit cells having a first bit cell end, a second bit cell end, a third bit cell end, and a fourth bit cell end;
a shared program transistor;
a shared read transistor; and
a read circuit,
wherein
each first bit cell end of each eFuse bit cell of the plurality of eFuse bit cells is coupled to the read circuit;
each second bit cell end of each eFuse bit cell of the plurality of eFuse bit cells is coupled to the shared program transistor and the shared read transistor;
each third bit cell end of each eFuse bit cell of the plurality of eFuse bit cells is configured to receive a program control line; and
each fourth bit cell end of each eFuse bit cell of the plurality of eFuse bit cells is configured to receive a read control line.

9. The eFuse memory array of claim 8, wherein
each eFuse bit cell of the plurality of eFuse bit cells further has a pair NMOS transistors coupled to an eFuse;
the shared program transistor is a PMOS transistor; and
the shared read transistor is an MOS transistor.

10. The eFuse memory array of claim 8, wherein
each eFuse bit cell of the plurality of eFuse bit cells further has a pair of PMOS transistors coupled to an eFuse;
the shared program transistor is an NMOS transistor; and
the shared read transistor is a PMOS transistor.

11. The eFuse memory array of claim 8, wherein
an eFuse bit cell of the plurality of eFuse bit cells includes
a cell program transistor having a program drain, a program source, and a program gate;
a cell read transistor having a read drain, a read source, and a read gate; and
an eFuse having a first eFuse end and a second eFuse end;
the program drain is coupled to the read source and the first bit cell end;
the second eFuse end is configured to serve as the second bit cell end; and
the read drain is configured to serve as the first bit cell end.

12. The eFuse memory array of claim 11, wherein
each of the cell program transistor and the cell read transistor is an NMOS transistor;
the program source is configured to receive a reference voltage; and
the shared program transistor is a PMOS transistor, a source of the shared program transistor is configured to receive a program voltage, a drain of the shared program transistor is coupled to the second bit cell end.

13. The eFuse memory array of claim 11, wherein
each of the cell program transistor and the cell read transistor is a PMOS transistor;
the program source is configured to receive a program voltage; and
the shared program transistor is an NMOS transistor, a source of the shared program transistor is configured to receive a reference voltage, a drain of the shared program transistor is coupled to the second bit cell end.

14. The eFuse memory array of claim 8, wherein
in a program operation, the shared read transistor is configured to be off, and the shared program transistor is configured to be on; and
in a read operation, the shared program transistor is configured to be off, and the shared read transistor is configured to be on.

15. The eFuse memory array of claim 8, wherein
in a program operation, the eFuse memory array is configured to have a program current flowing between the shared program transistor, an eFuse of an eFuse bit cell to be programmed, and a cell program transistor of the eFuse bit cell to be programmed; and
in a read operation, the eFuse memory array is configured to have a read current flowing between the shared read transistor, an eFuse of an eFuse bit cell to be read, and a cell read transistor of the eFuse bit cell to be read.

16. The eFuse array of claim 8, wherein the first bit cell end is configured to provide a state of an eFuse of the respective eFuse bit cell among the plurality of eFuse bit cells.

17. The eFuse memory array of claim 15, wherein the program current and the read current flow in opposite directions and/or the program current is greater than the read current.

18. A method comprising:
in a program mode of an electrical fuse (eFuse) bit cell having a program transistor, a read transistor, and an eFuse having a first end and a second end,
turning off the read transistor,
turning on the program transistor, and
configuring a program current to flow between the program transistor and the eFuse; and
in a read mode of the eFuse bit cell,
turning off the program transistor,
turning on the read transistor, and
configuring a read current to flow between the read transistor and the eFuse, and
detecting a voltage value at a first terminal of the read transistor to determine a state of the eFuse,
wherein a second terminal of the program transistor, a third terminal of the read transistor, and the first end of the eFuse are coupled together.

19. The method of claim 18, wherein
the program transistor and the read transistor are each an NMOS transistor;
a source of the program transistor receives a reference voltage; and
the second end of the eFuse receives a program voltage.

20. The method of claim 18, wherein
the program transistor and the read transistor are each a PMOS transistor;
a source of the program transistor receives a program voltage; and
the second end of the eFuse receives a program current.

21. The method of claim 18, wherein the program current and the read current flow in opposite directions and/or the program current is greater than the read current.

22. A method comprising:
in a program mode of an eFuse bit cell to be programmed among a plurality of eFuse bit cells,
turning off a shared read transistor,
turning off a cell read transistor of the eFuse bit cell to be programmed, turning on a shared program transistor,
turning on a cell program transistor of the eFuse bit cell to be programmed, and
configuring a program current to flow between the shared program transistor, the cell program transistor of the eFuse bit cell to be programmed, and an eFuse of the eFuse bit cell to be programmed; and
in a read mode of an eFuse bit cell to be read among the plurality of eFuse bit cells,
turning off the shared program transistor,
turning off a cell program transistor of the eFuse bit cell to be read,
turning on the shared read transistor,
turning on a cell read transistor of the eFuse bit cell to be read,
configuring a read current to flow between the shared read transistor, the cell read transistor of the eFuse bit cell to be read, and an eFuse of the eFuse bit cell to be read, and
detecting a voltage value at a first terminal of the cell read transistor of the eFuse bit cell to be read to determine a state of the eFuse of the eFuse bit cell to be read,
wherein
an eFuse bit cell of the plurality of eFuse bit cell includes a cell program transistor, a cell read transistor, and an eFuse, the cell program transistor, the cell read transistor, and a first end of the eFuse are coupled together; and
the shared program transistor, the shared read transistor, and a second end of the eFuse are coupled together.

23. The method of claim 22, wherein
the shared program transistor is a PMOS transistor;
a source of the shared program transistor receives a program voltage;
the cell program transistor and the cell read transistor are each an NMOS transistor;
a source of the cell program transistor receives a reference voltage; and
the shared read transistor is an NMOS transistor.

24. The method of claim 22, wherein
the shared program transistor is an NMOS transistor;
a source of the shared program transistor receives a reference voltage;
the cell program transistor and the cell read transistor are each a PMOS transistor;
a source of the cell program transistor receives a program voltage; and
the shared read transistor is a PMOS transistor.

25. The method of claim 22, wherein the program current and the read current flow in opposite directions and/or the program current is greater than the read current.

* * * * *